(12) United States Patent
Hirosaki et al.

(10) Patent No.: US 7,687,221 B2
(45) Date of Patent: Mar. 30, 2010

(54) POSITIVE RESIST COMPOSITION AND RESIST PATTERN FORMING METHOD

(75) Inventors: Taako Hirosaki, Kawasaki (JP); Tomoyuki Ando, Kawasaki (JP); Takuma Hojo, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 235 days.

(21) Appl. No.: 11/813,765

(22) PCT Filed: Dec. 14, 2005

(86) PCT No.: PCT/JP2005/022971
§ 371 (c)(1),
(2), (4) Date: Jul. 11, 2007

(87) PCT Pub. No.: WO2006/085419
PCT Pub. Date: Aug. 17, 2006

(65) Prior Publication Data
US 2009/0047600 A1     Feb. 19, 2009

(30) Foreign Application Priority Data
Feb. 10, 2005  (JP) ............................. 2005-034103

(51) Int. Cl.
G03F 7/039  (2006.01)
G03F 7/20  (2006.01)
G03F 7/30  (2006.01)

(52) U.S. Cl. .................. 430/270.1; 430/907; 430/910; 430/326

(58) Field of Classification Search ........................ None
See application file for complete search history.

(56) References Cited

U.S. PATENT DOCUMENTS

| 6,479,211 | B1 * | 11/2002 | Sato et al. ................ 430/270.1 |
| 6,627,381 | B1 | 9/2003 | Uetani et al. |
| 2003/0031952 | A1 | 2/2003 | Harada et al. |
| 2003/0125511 | A1 | 7/2003 | Choi et al. |
| 2004/0023153 | A1 | 2/2004 | Takeda et al. |
| 2005/0026073 | A1 | 2/2005 | Sasaki |
| 2007/0042288 | A1 | 2/2007 | Hojo et al. |

FOREIGN PATENT DOCUMENTS

| EP | 1462858 | 9/2004 |
| JP | 2001201853 | 7/2001 |
| JP | 2002006501 | 1/2002 |
| JP | 2002220420 | 8/2002 |
| JP | 2002341538 | 11/2002 |
| JP | 2003302754 | 10/2003 |

OTHER PUBLICATIONS

International Search Report from PCT/JP2005/022971, dated Jan. 17, 2006.

* cited by examiner

*Primary Examiner*—Sin J. Lee
(74) *Attorney, Agent, or Firm*—Knobbe, Martens, Olson & Bear, LLP

(57) ABSTRACT

Disclosed is a positive resist composition which can provide a positive resist composition and a resist pattern forming method, capable of forming a high resolution pattern with reduce LER, the positive resist composition comprising a resin component (A) which has acid dissociable, dissolution inhibiting groups and exhibits increased alkali solubility under the action of an acid, and an acid generator component (B) which generates an acid under exposure, wherein the resin component (A) contains a polymer compound (A1) having a structural unit (a1) derived from hydroxystyrene and a structural unit (a2) derived from an acrylate ester having acid dissociable, dissolution inhibiting groups, a fluorine atom or a fluorinated lower alkyl group being bonded at the α-position.

11 Claims, No Drawings

POSITIVE RESIST COMPOSITION AND RESIST PATTERN FORMING METHOD

RELATED APPLICATIONS

This application is the U.S. National Phase filing under 35 U.S.C. §371 of PCT/JP2005/022971, filed Dec. 14, 2005, which designated the United States and was published in a language other than English, which claims priority under 35 U.S.C. §119(a)-(d) to Japanese Patent Application No. 2005-034103, filed Feb. 10, 2005. The content of these applications is incorporated herein by reference in their entireties.

TECHNICAL FIELD

The present invention relates to a positive resist composition, and a resist pattern forming method.

BACKGROUND ART

In photolithography techniques, for example, there can be performed the steps of forming a resist film made of a resist composition on a substrate, selectively exposing the resist film to radiation such as light or electron beam through a photomask having a predetermined pattern formed thereon, and subjecting to a development treatment to form a resist pattern having a predetermined shape on the resist film. A resist composition in which the exposed area shifts to be soluble in a developing solution is referred to as a positive resist composition, whereas, a resist composition in which the exposed area shifts to be insoluble in a developing solution is referred to as a negative resist composition.

In recent years, advances in lithography techniques have lead to ongoing, rapid miniaturization of resist patterns in the production of semiconductor devices and liquid crystal display devices. As means for miniaturization, further progress has been made in shortening of the wavelength of exposure light. Although ultraviolet ray typified by g-ray or i-ray has conventionally been used, KrF excimer laser (248 nm) is introduced at present and ArF excimer laser (193 nm) begins to be introduced. A study has been made on $F_2$ excimer laser (157 nm), EUV (Extreme Ultra Violet), electron beam and X-ray, each having a shorter wavelength.

To reproduce a pattern having a miniaturized size, a resist material having high resolution is required. As such a resist material, a chemically amplified resist composition containing a base resin and an acid generator which generates an acid under exposure is used. For example, a positive chemically amplified photoresist contains a resin component which exhibits increased alkali solubility under the action of an acid, and an acid generator component which generates an acid under exposure and, when the acid is generated from the acid generator under exposure during the formation of a resist pattern, the exposed area shifts to an alkali soluble state.

As the resin component of the chemically amplified positive resist composition, there can be commonly used a resin in which hydroxyl groups of a polyhydroxystyrene (PHS) based resin are protected with acid dissociable, dissolution inhibiting groups, and a resin in which carboxy groups of a resin (acrylic resin) comprising a structural unit derived from (meth)acrylic acid in the main chain are protected with acid dissociable, dissolution inhibiting groups.

As the acid dissociable, dissolution inhibiting groups, there can be used a so-called acetal group, for example, a chain ether group typified by a 1-ethoxyethyl group and a cyclic ether group typified by a tetrahydropyranyl group; a tertiary alkyl group typified by a tert-butyl group; and a tertiary alkoxycarbonyl group typified by a tert-butoxycarbonyl group (see, for example, Japanese Unexamined Patent Application, First Publication No. 2002-341538).

However, when a resist pattern is formed using such a material, there arises a problem that roughness (line edge roughness (LER)) occurs on the surface of a side wall of a pattern. A problem of LER becomes more serious as a trial of forming a higher resolution pattern is made. With further progress of miniaturization of a resist pattern, high resolution is further required and thus an improvement in LER becomes more important.

DISCLOSURE OF THE INVENTION

Under these circumstances, the present invention has been completed and an object of the present invention is to provide a positive resist composition and a resist pattern forming method, which can form a high resolution pattern with reduce LER.

To achieve the above object, the present invention employed the following compositions.

A first aspect of the present invention provides a positive resist composition comprising a resin component (A) which has acid dissociable, dissolution inhibiting groups and exhibits increased alkali solubility under the action of an acid, and an acid generator component (B) which generates an acid under exposure, wherein the resin component (A) includes a polymer compound (A1) having a structural unit (a1) derived from hydroxystyrene and a structural unit (a2) derived from an acrylate ester having acid dissociable, dissolution inhibiting groups, a fluorine atom or a fluorinated lower alkyl group being bonded at the α-position.

A second aspect of the present invention provides a resist pattern forming method comprising the steps of forming a resist film on a substrate using the positive resist composition of the first aspect, selectively exposing the resist film, and alkali-developing the resist film to form a resist pattern.

In the present specification and claims, "structural unit" means a monomer unit constituting a resin component (polymer compound).

Concept of "hydroxystyrene" includes hydroxystyrene in the narrow sense, and those in which hydrogen atoms at the α-position of hydroxystyrene in the narrow sense are substituted with other substituents such as halogen atom, alkyl group and halogenated alkyl group, and derivatives thereof. "Structural unit derived from hydroxystyrene" means a structural unit formed by cleavage of an ethylenic double bond of hydroxystyrene. α-position (carbon atom at the α-position)" of a structural unit derived from hydroxystyrene means a carbon atom to which a benzene ring is bonded unless otherwise specified.

"Structural unit derived from an acrylate ester" means a structural unit formed by cleavage of an ethylenic double bond of an acrylate ester. Concept of "acrylate ester" includes, in addition to an acrylate ester in which a hydrogen atom is bonded to a carbon atom at the α-position, those in which a substituent (an atom or group other than a hydrogen atom) is bonded at the α-position. Examples of the substituent include a halogen atom such as fluorine atom, an alkyl group, and a halogenated alkyl group. In the present invention, a structural unit (a2) derived from an acrylate ester in which a fluorine atom or a fluorinated lower alkyl group is bonded at the α-position is contained as an essential unit. The α-position (carbon atom at the α-position) of a structural unit derived from an acrylate ester means a carbon atom to which a carbonyl group is bonded unless otherwise specified.

Unless otherwise specified, "alkyl group" includes linear, branched chain and cyclic monovalent saturated hydrocarbon groups.

Concept of "exposure" includes entire irradiation with radiation and also includes irradiation with electron beam.

According to the present invention, there are provided a positive resist composition and a resist pattern forming method, which can form a high resolution pattern with reduced LER.

BEST MODE FOR CARRYING OUT THE INVENTION (Positive Resist Composition)

The positive resist composition of the present invention is a positive resist composition including a resin component (A) which has acid dissociable, dissolution inhibiting groups and exhibits increased alkali solubility under the action of an acid (hereinafter referred to as a component (A)), and an acid generator component (B) which generates an acid under exposure (hereinafter referred to as a component (B)).

In such a positive resist composition, when an acid is generated from the component (B) under exposure, the acid dissociates the acid dissociable, dissolution inhibiting groups of the component (A), resulting in increased alkali solubility. Therefore, when a resist composition applied on a substrate is selectively exposed during the formation of a resist pattern, alkali solubility of the exposed area increases, and thus making it possible to perform alkali development.

(Component (A))

It is necessary that the component (A) includes a polymer compound (A1) having a structural unit (a1) derived from hydroxystyrene and a structural unit (a2) derived from an acrylate ester having acid dissociable, dissolution inhibiting groups, a fluorine atom or a fluorinated lower alkyl group being bonded at the α-position.

Polymer Compound (A1)

The structural unit (a1) is a structural unit derived from hydroxystyrene. By a combination of the structural unit (a1) and the structural unit (a2) described hereinafter, a high resolution pattern with reduced LER can be formed. Also, dry etching resistance is improved by comprising the structural unit (a1). Furthermore, there is such an advantage that hydroxystyrene as a raw material is easily available and is low cost.

The structural unit (a1) includes, for example, a structural unit represented by the following general formula (a1-1):

[Chemical Formula 1]

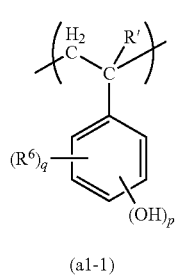

(a1-1)

wherein R' represents a hydrogen atom, a lower alkyl group having 1 to 5 carbon atoms, a fluorine atom, or a fluorinated lower alkyl group; $R^6$ represents a lower alkyl group having 1 to 5 carbon atoms; p represents an integer of 1 to 3; and q represents an integer of 0 or 1 to 2.

In the general formula (a1-1), R' represents a hydrogen atom, a lower alkyl group, a fluorine atom, or a fluorinated lower alkyl group.

The lower alkyl group as for R' is an alkyl group having 1 to 5 carbon atoms and is preferably a linear or branched alkyl group, and examples thereof include a methyl group, an ethyl group, a propyl group, an isopropyl group, an n-butyl group, an isobutyl group, a tert-butyl group, a pentyl group, an isopentyl group, and a neopentyl group. From an industrial point of view, a methyl group is preferable.

The fluorinated lower alkyl group is a group in which a portion or all of hydrogen atoms of the lower alkyl group having 1 to 5 carbon atoms are substituted with a fluorine atom. In the present invention, all hydrogen atoms are preferably fluorinated. The fluorinated lower alkyl group is preferably a linear or branched fluorinated lower alkyl group, more preferably a trifluoromethyl group, a pentafluoroethyl group, a heptafluoropropyl group, or a nonafluorobutyl group, and most preferably a trifluoromethyl group ($—CF_3$).

R' is preferably a hydrogen atom or a methyl group, and more preferably a hydrogen atom.

The lower alkyl group having 1 to 5 carbon atoms as for $R^6$ includes the same groups as those of the lower alkyl group as for R'.

q is an integer of 0 or 1 to 2. q is preferably 0 or 1, and particularly preferably 0 from an industrial point of view.

The substitution position of $R^6$ may be the o-position, the m-position, or the p-position, when q is 1. When q is 2, any substitution positions can be combined.

p is an integer of 1 to 3, and preferably 1.

The substitution position of the hydroxyl group may be the o-position, the m-position, or the p-position when p is 1, and is preferably the p-position in view of availability and low cost. When p is 2 or 3, any substitution positions can be combined.

The structural unit (a1) can be used alone, or two or more kinds of them can be used in combination.

The proportion of the structural unit (a1) in the polymer compound (A1) is preferably from 10 to 85 mol %, more preferably from 15 to 70 mol %, still more preferably from 20 to 60 mol %, and particularly preferably from 25 to 55 mol %, based on the entire structural units constituting the polymer compound (A1). When the proportion of the structural unit is within the above range, proper alkali solubility can be obtained and balance with other structural units is excellent.

The structural unit (a2) is a structural unit derived from an acrylate ester having acid dissociable, dissolution inhibiting groups, a fluorine atom or a fluorinated lower alkyl group being bonded at the α-position.

In the structural unit (a2), the fluorine atom or fluorinated lower alkyl group bonded at the α-position of the acrylate ester includes the same atoms or groups as those of the fluorine atom or fluorinated lower alkyl group as for R' of the above formula (a1-1). In the structural unit (a2), the fluorinated lower alkyl group is preferably bonded at the α-position of the acrylate ester.

The structural unit (a2) includes a structural unit represented by the following general formula (a2-1):

[Chemical Formula 2]

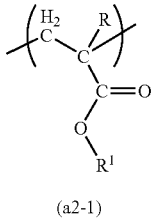

(a2-1)

wherein R represents a fluorine atom or a fluorinated lower alkyl group, and $R^1$ represents acid dissociable, dissolution inhibiting groups, or an organic group having acid dissociable, dissolution inhibiting groups.

Hereinafter, the acid dissociable, dissolution inhibiting groups and the organic group having the acid dissociable, dissolution inhibiting groups are generically referred to as acid dissociable, dissolution inhibiting group-containing groups.

The acid dissociable, dissolution inhibiting groups are not specifically limited and can be used by appropriately selecting from various groups proposed in resins for resist composition, for example, resins for KrF excimer laser and ArF excimer laser. Specific examples thereof include the following acid dissociable, dissolution inhibiting groups (I), (III) and (IV).

The organic group having acid dissociable, dissolution inhibiting groups are not specifically limited and can be used by appropriately selecting from various groups proposed in resins for resist composition, for example, resins for KrF excimer laser and ArF excimer laser. Specific examples thereof include the following acid dissociable, dissolution inhibiting groups (II).

Acid Dissociable, Dissolution Inhibiting Groups (I)

The acid dissociable, dissolution inhibiting groups (I) are groups represented by the following general formula (I). Effects of the present invention are further improved when the acid dissociable, dissolution inhibiting group-containing groups include acid dissociable, dissolution inhibiting groups (I):

[Chemical Formula 3]

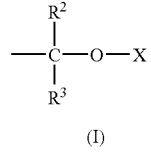

(I)

wherein X represents an aliphatic cyclic group, an aromatic cyclic hydrocarbon group, or a lower alkyl group; $R^2$ represents a hydrogen atom or a lower alkyl group, or X and $R^2$ each independently represents an alkylene group having 1 to 5 carbon atoms and the end of X and the end of $R^2$ may be bonded; and $R^3$ represents a lower alkyl group or a hydrogen atom.

In the formula (I), X represents an aliphatic cyclic group, an aromatic cyclic hydrocarbon group, or a lower alkyl group.

Herein, "aliphatic" in the present specification and claims means relative concept to aromatic, and is defined as a group or compound which has no aromaticity. "Aliphatic cyclic group" means a monocyclic or polycyclic group having no aromaticity and may be saturated or unsaturated, but is preferably saturated, usually.

The aliphatic cyclic group in X is a monovalent aliphatic cyclic group. The aliphatic cyclic group can be used by appropriately selecting from various groups proposed in a conventional ArF resist. Specific examples of the aliphatic cyclic group include an aliphatic monocyclic group having 5 to 7 carbon atoms and an aliphatic polycyclic group having 10 to 16 carbon atoms. The aliphatic monocyclic group having 5 to 7 carbon atoms includes a group in which one hydrogen atom is eliminated from monocycloalkane, and specific examples thereof include a group in which one hydrogen atom is eliminated from cyclopentane or cyclohexane. The aliphatic polycyclic group having 10 to 16 carbon atoms includes a group in which one hydrogen atom is eliminated from bicycloalkane, tricycloalkane, or tetracycloalkane. Specific examples thereof include a group in which one hydrogen atom is eliminated from a polycycloalkane such as adamantane, norbornane, isobornane, tricyclodecane, or tetracyclododecane. Among these groups, an adamantyl group, a norbornyl group, and a tetracyclododecanyl group are preferably from an industrial point of view, and an adamantyl group is particularly preferable.

The aromatic cyclic hydrocarbon group as for X includes an aromatic polycyclic group having 10 to 16 carbon atoms. Specific examples thereof include a group in which one hydrogen atom is eliminated from naphthalene, anthracene, phenanthrene, or pyrene. Specific examples thereof include a 1-naphthyl group, a 2-naphthyl group, a 1-anthracenyl group, a 2-anthracenyl group, a 1-phenanthryl group, a 2-phenanthryl group, a 3-phenanthryl group, and a 1-pyrenyl group, among which a 2-naphthyl group is particularly preferable from an industrial point of view.

The lower alkyl group as for X includes the same groups as those of the lower alkyl group as for R' of the above formula (a1-1).

In the structural unit (a2), X is preferably a lower alkyl group, more preferably a methyl group or an ethyl group, and most preferably an ethyl group.

In the formula (I), the lower alkyl group as for $R^2$ includes the same groups as those as of the lower alkyl group as for R' of the above formula (a1-1). A methyl group or an ethyl group is preferably from an industrial point of view, and a methyl group is particularly preferable.

$R^3$ represents a lower alkyl group or a hydrogen atom. The lower alkyl group as for $R^3$ includes the same group as those of the lower alkyl group as for $R^2$. $R^3$ is preferably a hydrogen atom from an industrial point of view.

In the formula (I), X and $R^2$ each independently represents an alkylene group having 1 to 5 carbon atoms and the end of X and the end of $R^2$ may be bonded.

In this case, in the formula (I), a cyclic group is formed by $R^2$, X, an oxygen atom bonded with X, the oxygen atom, and a carbon atom bonded with $R^2$. The cyclic group is preferably a 4- to 7-membered ring, and more preferably a 4- to 6-membered ring. Specific examples of the cyclic group include a tetrahydropyranyl group and a tetrahydrofuranyl group.

The acid dissociable, dissolution inhibiting groups (I) are particularly preferably groups in which $R^3$ is a hydrogen atom because of excellent effects of the present invention. Specific examples thereof include a group in which X is an alkyl group, that is, a 1-alkoxyalkyl group, which includes a 1-methoxyethyl group, a 1-ethoxyethyl group, a 1-iso-propoxyethyl group, a 1-n-butoxyethyl group, a 1-tert-butoxyethyl group, a methoxymethyl group, an ethoxymethyl group, an iso-propoxymethyl group, an n-butoxymethyl group, and a tert-butoxymethyl group. The group in which X is an aliphatic cyclic group includes a 1-cyclohexyloxyethyl group, a 1-(2-adamantyl)oxymethyl group, and a 1-(1-adamantyl)oxyethyl group represented by the following formula (I-a). The group in which X is an aromatic cyclic hydrocarbon group includes a 1-(2-naphthyl)oxyethyl group represented by the following formula (I-b).

Among these groups, a 1-ethoxyethyl group is particularly preferable.

[Chemical Formula 4]

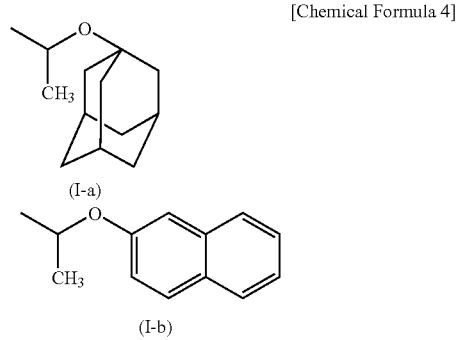

Organic Group Having Acid Dissociable, Dissolution Inhibiting Groups (II)

The organic group having acid dissociable, dissolution inhibiting groups (II) are groups represented by the following general formula (II). Effects of the present invention are further improved when the acid dissociable, dissolution inhibiting group-containing groups include the organic group having acid dissociable, dissolution inhibiting groups (II), and exposure margin is also improved:

[Chemical Formula 5]

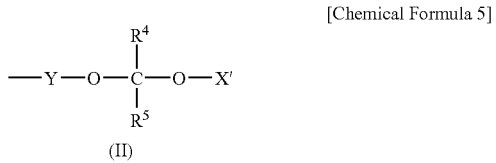

wherein X' represents an aliphatic cyclic group, an aromatic cyclic hydrocarbon group, or a lower alkyl group; $R^4$ represents a hydrogen atom or a lower alkyl group, or X' and $R^4$ each independently represents an alkylene group having 1 to 5 carbon atoms and the end of X' and the end of $R^4$ may be bonded; $R^5$ represents a lower alkyl group or a hydrogen atom; and Y represents an aliphatic cyclic group.

In the formula (II), X', $R^4$ and $R^5$ include the same group as those of X, $R^2$ and $R^3$ in the above formula (I).

The aliphatic cyclic group as for Y includes a group in which one hydrogen atom is further eliminated from the aliphatic cyclic group in X.

Acid Dissociable, Dissolution Inhibiting Groups (III)

The acid dissociable, dissolution inhibiting groups (III) are chain or cyclic tertiary alkyl groups. When the acid dissociable, dissolution inhibiting group-containing groups include the acid dissociable, dissolution inhibiting groups (III), effects of the present invention are improved. Also, exposure margin is improved.

The chain tertiary alkyl group preferably has 4 to 10 carbon atoms, and more preferably 4 to 8 carbon atoms. Specific examples of the chain tertiary alkyl group include a tert-butyl group and a tert-amyl group.

The cyclic tertiary alkyl group is a monocyclic or polycyclic monovalent saturated hydrocarbon group containing a tertiary carbon atom on the ring. The cyclic tertiary alkyl group preferably 4 to 12 carbon atoms, and more preferably 5 to 10 carbon atoms. Specific examples of the cyclic tertiary alkyl group include a 1-methylcyclopentyl group, a 1-ethylcyclopentyl group, a 1-methylcyclohexyl group, a 1-ethylcyclohexyl group, a 2-methyl-2-adamantyl group, and a 2-ethyl-2-adamantyl group.

The acid dissociable, dissolution inhibiting groups (III) are preferably chain tertiary alkyl groups, and particularly tert-butyl groups, because of excellent effects of the present invention and excellent exposure margin Acid Dissociable, Dissolution Inhibiting Group (IV)

The acid dissociable, dissolution inhibiting groups (IV) are acid dissociable, dissolution inhibiting group-containing groups which do not belong to the above acid dissociable, dissolution inhibiting groups and the above organic groups having acid dissociable, dissolution inhibiting groups (hereinafter referred to as "acid dissociable, dissolution inhibiting groups") (I) to (III). It is possible to use, as the acid dissociable, dissolution inhibiting group-containing group (IV), optional acid dissociable, dissolution inhibiting group-containing groups, which do not belong to the above acid dissociable, dissolution inhibiting groups (I) to (III), among conventionally known acid dissociable, dissolution inhibiting group-containing group, and specific examples thereof include a chain tertiary alkoxycarbonyl group and a chain tertiary alkoxycarbonylalkyl group.

The chain tertiary alkoxycarbonyl group preferably has 4 to 10 carbon atoms, and more preferably 4 to 8 carbon atoms. Specific examples of the chain tertiary alkoxycarbonyl group include a tert-butoxycarbonyl group and a tert-amyloxycarbonyl group.

The chain tertiary alkoxycarbonylalkyl group preferably has 4 to 10 carbon atoms, and more preferably 4 to 8 carbon atoms. Specific examples of the chain tertiary alkoxycarbonylalkyl group include a tert-butoxycarbonylmethyl group and a tert-amyloxycarbonylmethyl group.

It is preferred to contain, as the acid dissociable, dissolution inhibiting group-containing group in the structural unit (a2), at least one kind selected from the group consisting of acid dissociable, dissolution inhibiting groups (I), (II) and (III) because of excellent effects of the present invention.

The structural unit (a2) can be used alone, or two or more kinds of them can be used in combination.

The proportion of structural unit (a2) in the polymer compound (A1) is preferably from 1 to 80 mol %, more preferably from 1 to 60 mol %, still more preferably from 1 to 50 mol %, particularly preferably from 1 to 40 mol %, and most preferably from 2 to 35 mol %, based on the entire structural units constituting the polymer compound (A1). When the proportion of structural unit is more than the lower limit, the resulting resist composition can form a pattern. When the proportion is upper limit or less, balance with other structural units is excellent.

It is preferred that the polymer compound (A1) further comprises a structural unit (a3) in which hydrogen atoms of a hydroxyl group in the structural unit (a1) are substituted with acid dissociable, dissolution inhibiting group-containing group. Consequently, high etching resistance and resolution can be achieved.

The acid dissociable, dissolution inhibiting group-containing groups in the structural unit (a3) include the same groups as those listed in the structural unit (a2). It is preferred to contain at least one kind selected from acid dissociable, dissolution inhibiting groups (I), (II) and (III) because of excellent effects of the present invention, and it is particularly preferred to contain acid dissociable, dissolution inhibiting groups (I).

The structural unit (a3) can be used alone, or two or more kinds of them can be used in combination.

The proportion of structural unit (a3) in the polymer compound (A1) is preferably from 5 to 50 mol %, more preferably from 5 to 45 mol %, still more preferably from 10 to 40 mol %, and particularly preferably from 15 to 40 mol %, based on the entire structural units constituting the polymer compound (A1). When the proportion of structural unit is the lower limit or more, high effect of comprising the structural unit (a3) is exerted. When the proportion is upper limit or less, balance with other structural units is excellent.

It is preferred that the polymer compound (A1) further comprises a structural unit (a4) derived from an acrylate ester having an alcoholic hydroxyl group, a fluorine atom or a fluorinated lower alkyl group being bonded at the α-position. Effects of the present invention are further improved by comprising such a structural unit (a4).

In the structural unit (a4), the fluorine atom or fluorinated lower alkyl group bonded at the α-position of the acrylate ester is the same as those in the structural unit (a2).

Preferable structural unit (a4) includes a structural unit which has a chain or cyclic alkyl group having an alcoholic hydroxyl group. That is, the structural unit (a4) is preferably a structural unit derived from an acrylate ester having an alcoholic hydroxyl group-containing chain or a cyclic alkyl group, a fluorine atom or fluorinated lower alkyl group being bonded at the α-position.

When the structural unit (a4) comprises a structural unit derived from an acrylate ester having an alcoholic hydroxyl group-containing cyclic alkyl group, a fluorine atom or fluorinated lower alkyl group being boned at the α-position (hereinafter sometimes referred simply to as a "structural unit having a hydroxyl group-containing cyclic alkyl group"), resolution is enhanced and also etching resistance is improved.

Also, when the structural unit (a4) comprises a structural unit derived from an acrylate ester having an alcoholic hydroxyl group-containing chain alkyl group, a fluorine atom or fluorinated lower alkyl group being boned at the α-position (hereinafter sometimes referred simply to as a "structural unit having a hydroxyl group-containing chain alkyl group"), hydrophilicity of the entire component (A) is enhanced and affinity with a developing solution is enhanced, and thus resolution is improved.

"Structural Unit Having Hydroxyl Group-Containing Cyclic Alkyl Group"

The structural unit having a hydroxyl group-containing cyclic alkyl group includes, for example, a structural unit in which a hydroxyl group-containing cyclic alkyl group is bonded to an ester group (—C(O)O—) of an acrylate ester. Herein, "hydroxyl group-containing cyclic alkyl group" is a group in which a hydroxyl group is bonded to a cyclic alkyl group.

It is preferred that 1 to 3 hydroxyl groups are bonded, and it is more preferred that one hydroxyl group is bonded.

The cyclic alkyl group may be monocyclic or polycyclic group, but is preferably a polycyclic group. The cyclic alkyl group preferably has 5 to 15 carbon atoms.

Specific examples of the cyclic alkyl group include the followings.

The monocyclic cyclic alkyl group includes a group in which 1 to 4 hydrogen atoms are eliminated from cycloalkane. Specific examples of the monocyclic cyclic alkyl group include a group in which 1 to 4 hydrogen atoms are eliminated from cyclopentane and cyclohexane, among which a cyclohexyl group is preferable.

The polycyclic cyclic alkyl group includes a group in which 1 to 4 hydrogen atoms are eliminated from bicycloalkane, tricycloalkane, or tetracycloalkane. Specific examples thereof include a group in which 1 to 4 hydrogen atoms are eliminated from a polycycloalkane such as adamantane, norbornane, isobornane, tricyclodecane, or tetracyclododecane.

Such a cyclic alkyl group can be used by appropriately selecting from various groups constituting acid dissociable, dissolution inhibiting groups proposed in a resin for photoresist composition used for ArF excimer laser process. Among these groups, a cyclohexyl group, an adamantyl group, a norbornyl group, and a tetracyclododecanyl group are preferable because they are easily available from an industrial point of view.

Among these monocyclic groups and polycyclic groups, a cyclohexyl group and an adamantyl group are preferable and an adamantyl group is particularly preferable.

Specific example of the structural unit having a hydroxyl group-containing cyclic alkyl group is preferably a structural unit (a4-1) represented by the following general formula (a4-1):

[Chemical Formula 6]

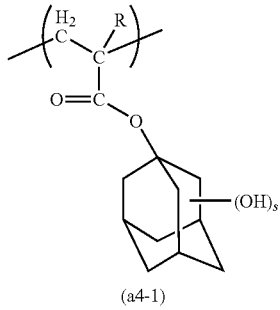

(a4-1)

wherein R represents a fluorine atom or a fluorinated lower alkyl group, and s represents an integer of 1 to 3.

In the formula (a4-1), the fluorine atom or fluorinated lower alkyl group as for R is the same as those of the fluorine atom or fluorinated lower alkyl group as for R in the above formula (a2-1).

S is an integer of 1 to 3 and 1 is most preferable.

The bonding position of the hydroxyl group is not specifically limited, but the hydroxyl group is preferably boned at the 3-position of the adamantyl group.

"Structural Unit Having Hydroxyl Group-Containing Chain Alkyl Group"

The structural unit having a hydroxyl group-containing chain alkyl group includes, for example, a structural unit in which a chain hydroxyalkyl group is bonded to an ester group (—C(O)O—) of an acrylate ester. Herein, "chain hydroxyalkyl group" means a group in which a portion or all of hydrogen atoms in a chain (linear or branched) alkyl group are substituted with a hydroxyl group.

The structural unit having a hydroxyl group-containing chain alkyl group is particularly preferably a structural unit (a4-2) represented by the following general formula (a4-2):

[Chemical Formula 7]

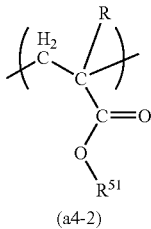

(a4-2)

wherein R represents a fluorine atom or a fluorinated lower alkyl group, and $R^{51}$ represents a chain hydroxyalkyl group.

R in the formula (a4-2) is the same those of R in the general formula (a4-1).

The hydroxyalkyl group as for $R^{51}$ is preferably a lower hydroxyalkyl group having 10 or less carbon atoms, more preferably a lower hydroxyalkyl group having 2 to 8 carbon atoms, and still more preferably a lower hydroxyalkyl group having 2 to 4 carbon atoms.

The number and the bonding of a hydroxyl group in the hydroxyalkyl group are not specifically limited and the number of the hydroxyl group is usually one and the bonding position is preferably the end of the alkyl group.

In the present invention, it is particularly preferred to comprise, as the structural unit (a4), at least a structural unit having a hydroxyl group-containing cyclic alkyl group.

The structural unit (a4) can be used alone, or two or more kinds of them can be used in combination.

The proportion of the structural unit (a4) in the polymer compound (A1) is preferably from 5 to 50 mol %, more preferably from 5 to 45 mol %, still preferably from 10 to 40 mol %, and particularly preferably from 15 to 40 mol %, based on the entire structural units of the polymer compound (A1). When the proportion of the structural unit is the lower limit or more, high effect of comprising the structural unit (a4) is exerted. When the proportion is the upper limit or less, balance with the other structural units is excellent.

The polymer compound (A1) may further comprises a structural unit (a5) derived from styrene.

In the present invention, the structural unit (a5) is not essential. However, when the structural unit is contained, solubility in a developing solution can be adjusted and alkali solubility can be controlled by the content, and thus LER can be further reduced. Also, there is an advantage that a good isolated line pattern can be obtained.

Concept of "styrene" includes styrene in the narrow sense, and those in which hydrogen atoms at the α-position of styrene in the narrow sense are substituted with other substituents such as halogen atom, alkyl group and halogenated alkyl group, and derivatives thereof. "Structural unit derived from styrene" means a structural unit formed by cleavage of an ethylenic double bond of styrene. Styrene may be substituted with a substituent in which the hydrogen atom of a phenyl group is a lower alkyl group.

The structural unit (a5) includes a structural unit represented by the following general formula (a5-1:

[Chemical Formula 8]

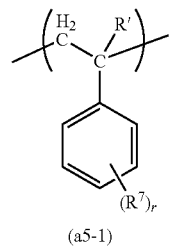

(a5-1)

wherein R' represents a hydrogen atom, a lower alkyl group having 1 to 5 carbon atoms, a fluorine atom, or a fluorinated lower alkyl group; $R^7$ represents a lower alkyl group having 1 to 5 carbon atoms; and r represents an integer of 0 or 1 to 3.

In the formula (a5-1), R' and $R^7$ include the same groups as those of R' and $R^6$ in the above formula (a1-1).

r is an integer of 0 or 1 to 3. r is preferably 0 or 1 and is particularly preferably 0 from an industrial point of view.

The substitution position of $R^7$ may be the o-position, the m-position, or the p-position, when r is from 1 to 3. When r is 2 or 3, any substitution positions can be combined.

The structural unit (a5) may be used alone, or two or more kinds of them may be used in combination.

When the polymer compound (A1) comprises the structural unit (a5), the proportion of the structural unit (a5) is preferably from 1 to 20 mol %, more preferably from 3 to 15 mol %, and still preferably from 5 to 15 mol %, based on the entire structural units of the polymer compound (A1). When the proportion of the structural unit is within the above range, high effect of comprising the structural unit (a5) is exerted. When the proportion is with in the above range, balance with the other structural units is excellent.

The polymer compound (A1) may comprise a structural unit (a6) other than the above structural units (a1) to (a5) as long as the effects of the present invention are not adversely affected.

The structural unit (a6) is not specifically limited as long as it is the other structural unit which does not belong to the above structural units (a1) to (a5), and it is possible to use various structural units which have conventionally been known as those used in resins for resist, such as resins for ArF excimer laser or KrF positive excimer laser (preferably for ArF excimer laser).

In the present invention, the polymer compound (A1) is preferably a copolymer comprising at least structural units (a1) and (a2).

Such a copolymer may be copolymer composed of structural units (a1) and (a2), or may be a copolymer comprising structural units (a1) and (a2), and at least one of structural units (a3), (a4) and (a5). Because of excellent effects of the present invention, a binary copolymer (A1-2) composed of structural units (a1) and (a2); a tertiary copolymer (A1-3) composed of structural units (a1), (a2) and (a3); a quaternary copolymer (A1-4-1) composed of structural units (a1), (a2), (a3) and (a4); and a quaternary copolymer (A1-4-2) composed of structural units (a1), (a2), (a3) and (a5) are preferable, and a tertiary copolymer (A1-3) and a quaternary copolymer (A1-4-1) are particularly preferable.

In the tertiary copolymer (A1-3), the proportion of the structural unit (a1) is preferably from 10 to 85 mol %, more preferably from 15 to 70 mol %, still more preferably from 20 to 60 mol %, and particularly preferably from 25 to 55 mol %, based on the entire structural units constituting the tertiary copolymer (A1-3). The proportion of the structural unit (a2) is preferably from 10 to 80 mol %, more preferably from 15 to 70 mol %, still more preferably from 20 to 50 mol %, and particularly preferably from 20 to 40 mol %. The proportion of the structural unit (a3) is preferably from 5 to 50 mol %, more preferably from 5 to 45 mol %, still more preferably from 10 to 40 mol %, and particularly preferably from 15 to 40 mol %.

In the quaternary copolymer (A1-4-1), the proportion of the structural unit (a1) is preferably from 10 to 89 mol %, more preferably from 20 to 80 mol %, still more preferably from 30 to 80 mol %, and particularly preferably from 40 to 70 mol %, based on the entire structural units constituting the quaternary copolymer (A1-4-1). The proportion of the structural unit (a2) is preferably from 1 to 80 mol %, more preferably from 1 to 60 mol %, still more preferably from 1 to 30 mol %, particularly preferably from 1 to 10 mol %, and most preferably from 2 to 8 mol %. The proportion of the structural unit (a3) is preferably from 5 to 50 mol %, more preferably from 5 to 45 mol %, still more preferably from 10 to 40 mol %, and particularly preferably from 15 to 40 mol %. The proportion of the structural unit (a4) is preferably from 5 to 50 mol %, more preferably from 5 to 45 mol %, still preferably from 10 to 40 mol %, and particularly preferably from 15 to 40 mol %.

These copolymers preferably have two or more kinds of groups selected from the group consisting of acid dissociable, dissolution inhibiting groups (I), (II) and (III) as the acid dissociable, dissolution inhibiting group-containing groups.

A combination of acid dissociable, dissolution inhibiting groups (I) and acid dissociable, dissolution inhibiting groups (II) or (III) is particularly preferable.

Also, a mixture of two or more kinds of tertiary or quaternary copolymers may be used. Examples of the mixture include a mixed resin (A1-3) comprising structural units each having a different proportion, a mixed resin (A1-4-1) comprising structural units each having a different proportion, and a mixture of mixed resins (A1-3) and (A1-4-1).

The polymer compound (A1) can be obtained by polymerizing a monomer, from which each structural unit is derived, using a conventional method, for example, a known radical polymerization method using a radical polymerization initiator such as azobisisobutyronitrile (AIBN). For example, a monomer in which a hydroxyl group of hydroxystyrene is protected with a protective group such as acetyl group, and a monomer corresponding to the structural unit (a2) are prepared and these monomers are copolymerized by a conventional method, and then the protective group is substituted with a hydrogen atom through hydrolysis to obtain a structural unit (a1).

A weight average molecular weight (polystyrene equivalent weight average molecular weight determined using gel permeation chromatography (GPC), this is to be repeated in the following) of the polymer compound (A1) is preferably from 3,000 to 30,000, more preferably from 5,000 to 20,000, and still more preferably from 5,000 to 15,000. When the weight average molecular weight is 30,000 or less, solubility in a resist solvent can be sufficiently ensured and thus LER can be reduced. When the weight average molecular weight is 3,000 or more, solubility in a developing solution is easily adjusted. Also, dry etching resistance is improved and thickness loss is improved.

The smaller the dispersion degree (Mw/Mn (number average molecular weight)) of the polymer compound (A1) (closer to monodispersion), the better resolution becomes, and it is preferred. The dispersion degree is preferably from 1.0 to 5.0, more preferably from 1.0 to 3.0, and most preferably from 1.0 to 2.5.

The polymer compound (A1) may be used alone, or two or more kinds of them may be used in combination.

The proportion of the polymer compound (A1) in the component (A) is preferably from 50 to 100% by mass, more preferably from 80 to 100% by mass, and most preferably 100% by mass, in view of the effects of the present invention.

In the present invention, it is possible to contain, as the component (A), resins used usually as a resin for chemically amplified positive resist, such as PHS based resin and acrylic resin, in addition to the polymer compound (A1) as long as the effects of the present invention are not adversely affected.

In the positive resist composition of the present invention, the content of the component (A) may be adjusted according to the thickness of the resist film to be formed.

(Component (B))

The component (B) is not specifically limited and it is possible to use those which have conventionally proposed as an acid generator for chemically amplified photoresist. As the acid generator, there have conventionally been known various acid generators, for example, an onium salt based acid generator such as iodonium salt or sulfonium salt; an oxime sulfonate based acid generator; an diazomethane based acid generator such as bisalkyl or bisarylsulfonyl diazomethanes or poly(bissulfonyl)diazomethanes; a nitrobenzylsulfonate based acid generator; an iminosulfonate based acid generator; and a disulfone based acid generator.

The onium salt based acid generator includes a compound represented by the following general formula (b-1) or (b-2):

[Chemical Formula 9]

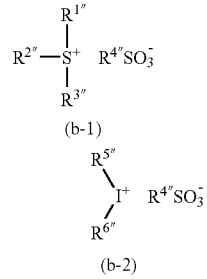

wherein $R^{1\prime\prime}$ to $R^{3\prime\prime}$ and $R^{5\prime\prime}$ to $R^{6\prime\prime}$ each independently represents an aryl group or alkyl group; $R^{4\prime\prime}$ represents a linear, branched or cyclic alkyl group or a fluorinated alkyl group; at least one of $R^{1\prime\prime}$ to $R^{3\prime\prime}$ represents an aryl group, and at least one of $R^{5\prime\prime}$ to $R^{6\prime\prime}$ represents an aryl group.

In the formula (b-1), $R^{1\prime\prime}$ to $R^{3\prime\prime}$ each independently represents an aryl group or an alkyl group. At least one of $R^{1\prime\prime}$ to $R^{3\prime\prime}$ represents an aryl group. Two or more of $R^{1\prime\prime}$ to $R^{3\prime\prime}$ are preferably aryl groups, and all of $R^{1\prime\prime}$ to $R^{3\prime\prime}$ are most preferably aryl groups.

The aryl group as for $R^{1\prime\prime}$ to $R^{3\prime\prime}$ is not specifically limited and is an aryl group having 6 to 20 carbon atoms, and a portion or all of hydrogen atoms of the aryl group may be substituted with an alkyl group, an alkoxy group, or a halogen atom or not. The aryl group is preferably an aryl group having 6 to 10 carbon atoms because it can be synthesized at low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group. The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group as for $R^{1''}$ to $R^{3''}$ is not specifically limited and includes, for example, a linear, branched or cyclic alkyl group having 1 to 10 carbon atoms. In view of excellent resolution, the number of carbon atoms is preferably from 1 to 5. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and decanyl group. A methyl group is preferable because it is excellent in resolution and also can be synthesized at low cost.

All of $R^{1''}$ to $R^{3''}$ are most preferably phenyl groups.

$R^{4''}$ represents a linear, branched or cyclic alkyl group or a fluorinated alkyl group.

The linear alkyl group preferably has 1 to 10 carbon atoms, more preferably 1 to 8 carbon atoms, and most preferably 1 to 4 carbon atoms.

The cyclic alkyl group is a cyclic group as shown in aforementioned $R^{1''}$ and preferably has 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. A fluorination rate (the proportion of a fluorine atom in the alkyl group) of the fluorinated alkyl group is preferably from 10 to 100 mol %, more preferably from 50 to 100 mol %, and particularly preferably the case where all hydrogen atoms are substituted with a fluorine atom because the strength of an acid increases.

$R^{4''}$ is most preferably a linear or cyclic alkyl group, or a fluorinated alkyl group.

In the formula (b-2), $R^{5''}$ to $R^{6''}$ each independently represents an aryl group or an alkyl group. At least one of $R^{5''}$ to $R^{6''}$ represents an aryl group. All of $R^{5''}$ to $R^{6''}$ are preferably aryl groups.

The aryl group as for $R^{5''}$ to $R^{6''}$ includes the same groups as those of the aryl group as for $R^{1''}$ to $R^{3''}$.

The alkyl group as for $R^{5''}$ to $R^{6''}$ includes the same groups as those of the alkyl group as for $R^{1''}$ to $R^{3''}$.

All of $R^{5''}$ to $R^{6''}$ are most preferably phenyl groups.

$R^{4''}$ in the formula (b-2) includes the same group as those of $R^{4''}$ in the above formula (b-1).

Specific examples of the onium salt based acid generator include trifluoromethane sulfonate or nonafluorobutane sulfonate of diphenyliodonium; trifluoromethane sulfonate or nonafluorobutane sulfonate of bis(4-tert-butylphenyl)iodonium; trifluoromethane sulfonate of triphenylsulfonium, heptafluoropropane sulfonate thereof, or nonafluorobutane sulfonate thereof; trifluoromethane sulfonate of tri(4-methylphenyl)sulfonium, heptafluoropropane sulfonate thereof, or nonafluorobutane sulfonate thereof; trifluoromethane sulfonate of dimethyl(4-hydroxynaphthyl)sulfonium, heptafluoropropane sulfonate thereof, or nonafluorobutane sulfonate thereof; trifluoromethane sulfonate of monophenyldimethylsulfonium, heptafluoropropane sulfonate thereof, or nonafluorobutane sulfonate thereof; trifluoromethane sulfonate of diphenylmonomethylsulfonium, heptafluoropropane sulfonate thereof, or nonafluorobutane sulfonate thereof; trifluoromethane sulfonate of (4-methylphenyl)diphenylsulfonium, heptafluoropropane sulfonate thereof, or nonafluorobutane sulfonate thereof; trifluoromethane sulfonate of (4-methoxyphenyl)diphenylsulfonium, heptafluoropropane sulfonate thereof, or nonafluorobutane sulfonate thereof; trifluoromethane sulfonate of tri (4-tert-butyl) phenylsulfonium, heptafluoropropane sulfonate thereof, or nonafluorobutane sulfonate thereof; and trifluoromethane sulfonate of diphenyl(1-(4-methoxy)naphthyl)sulfonium, heptafluoropropane sulfonate thereof, or nonafluorobutane sulfonate thereof. It is also possible to use onium salts in which an anion moiety of these onium salts is replaced by methane sulfonate, n-propane sulfonate, n-butane sulfonate, and n-octane sulfonate.

It is also possible to use those in which the anion moiety is replaced by an anion moiety represented by the following general formula (b-3) or (b-4) in the general formula (b-1) or (b-2) (a cation moiety is the same as that in (b-1) or (b-2):

[Chemical Formula 10]

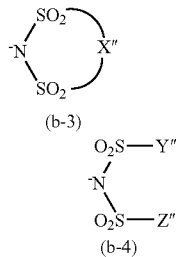

wherein X" represents an alkylene group having 2 to 6 carbon atoms in which at least one hydrogen atom is substituted with a fluorine atom; and Y" and Z" each independently represents an alkyl group having 1 to 10 carbon atoms in which at least one hydrogen atom is substituted with a fluorine atom.

X" is a linear or branched alkylene group in which at least one hydrogen atom is substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom is substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group as for X" or the number of carbon atoms of the alkyl group as for Y" and Z" within the above range of the number of carbon atoms, the better, because solubility in a resist solvent is also good.

In the alkylene group as for X" or the alkyl group as for Y" and Z", the larger the number of hydrogen atoms substituted with a fluorine atom, the better, because the strength of the acid increases and transparency to high energy light or electron beam having a wavelength of 200 nm or less is improved. A fluorination rate of the alkylene group or alkyl group, namely, the proportion of hydrogen atoms substituted with a fluorine atom, among hydrogen atoms of the alkylene group or alkyl group in which any hydrogen atoms are not substituted with a fluorine atom, is preferably from 70 to 100%, more preferably from 90 to 100%, and most preferably the case of a perfluoroalkylene group or a perfluoroalkyl group in which all hydrogen atoms are substituted with a fluorine atom.

In the present invention, an onium salt having a camphorsulfonic acid ion can also be used as the anion moiety having comparatively weak acid strength in the onium salt based acid generator. The cation moiety is the same as that represented by the general formula (b-1) or (b-2). Specific examples thereof include a compound represented by the following chemical formula:

[Chemical Formula 11]

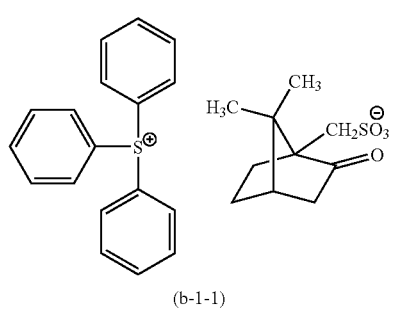

(b-1-1)

In the present invention, the oxime sulfonate based acid generator is a compound which has at least one group represented by the following general formula (B-1) and has properties capable of generating an acid under irradiation with radiation. Such an oxime sulfonate based acid generator is widely used for a chemically amplified photoresist composition and can be used by optional selection:

[Chemical Formula 12]

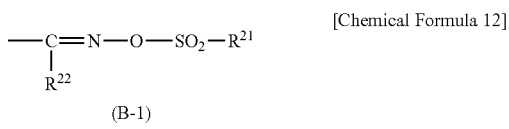

(B-1)

in the formula (B-1), $R^{21}$ and $R^{22}$ each independently represents an organic group.

In the present invention, the organic group is a group having a carbon atom, and may have an atom other than the carbon atom (for example, hydrogen atom, oxygen atom, nitrogen atom, sulfur atom, and halogen atom (fluorine atom, chlorine atom, etc.)).

The organic group as for $R^{21}$ is preferably a linear, branched or cyclic alkyl or aryl group. These alkyl and aryl groups may have a substituent. The substituent is not specifically limited and includes, for example, a fluorine atom, and a linear, branched or cyclic alkyl group having 1 to 6 carbon atoms. Herein, the phrase "having a substituent" means that a portion or all of hydrogen atoms of the alkyl group or aryl group is substituted with a substituent.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. The alkyl group is particularly preferably a partially or completely halogenated alkyl group (hereinafter sometimes referred to as a halogenated alkyl group). The partially halogenated alkyl group means an alkyl group in which a portion of hydrogen atom are substituted with a halogen atom, while the completely halogenated alkyl group means an alkyl group in which all of hydrogen atom are substituted with a halogen atom. The halogen atom includes a fluorine atom, a chlorine atom, a bromine atom, and an iodine atom, and is particularly preferably a fluorine atom. Namely, the halogenated alkyl group is preferably a fluorinated alkyl group.

The aryl group preferably has 4 to 20 carbon atoms, more preferably 4 to 10 carbon atoms, and most preferably 6 to 10 carbon atoms. The aryl group is particularly preferably a partially or completely halogenated aryl group. The partially halogenated aryl group means an aryl group in which a portion of hydrogen atom are substituted with a halogen atom, while the completely halogenated aryl group means an aryl group in which all of hydrogen atom are substituted with a halogen atom.

$R^{21}$ is particularly preferably an alkyl group having 1 to 4 carbon atoms, which has no substituent, or a fluorinated alkyl group having 1 to 4 carbon atoms.

The organic group as for $R^{22}$ is preferably a linear, branched or cyclic alkyl, aryl or cyano group. The alkyl group and aryl group as for $R^{22}$ include the same groups as those of the alkyl group and aryl group listed as for $R^{21}$.

$R^{22}$ is particularly preferably a cyano group, an alkyl group having 1 to 8 carbon atoms, which has no substituent, or a fluorinated alkyl group having 1 to 8 carbon atoms.

The oxime sulfonate based acid generator is more preferably a compound represented by the following general formula (B-2) or (B-3):

[Chemical Formula 13]

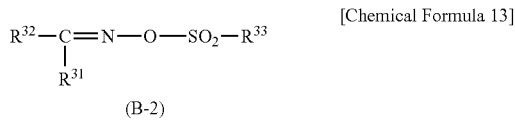

(B-2)

in the formula (B-2), $R^{31}$ represents a cyano group, an alkyl group having no substituent, or a halogenated alkyl group; $R^{32}$ represents an aryl group; and $R^{33}$ represents an alkyl group having no substituent, or a halogenated alkyl group:

[Chemical Formula 14]

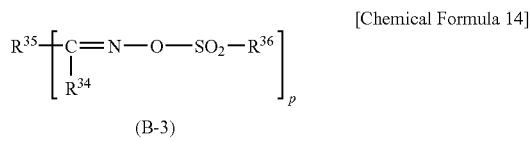

(B-3)

in the formula (B-3), $R^{34}$ represents a cyano group, an alkyl group having no substituent, or a halogenated alkyl group; $R^{35}$ represents a di- or trivalent aromatic hydrocarbon group; $R^{36}$ represents an alkyl group having no substituent, or a halogenated alkyl group; and p represents 2 or 3.

In the general formula (B-2), the alkyl group having no substituent or halogenated alkyl group as for $R^{31}$ preferably has 1 to 10 carbon atoms, more preferably 1 to 8 carbon atoms, and most preferably 1 to 6 carbon atoms.

$R^{31}$ is preferably a halogenated alkyl group, and more preferably a fluorinated alkyl group.

In the fluorinated alkyl group as for $R^{31}$, 50% or more of hydrogen atoms of the alkyl group are preferably fluorinated, 70% or more of hydrogen atoms of the alkyl group are more preferably fluorinated, and 90% or more of hydrogen atoms of the alkyl group are still more preferably fluorinated.

Examples of the aryl group as for $R^{32}$ include a group in which one hydrogen atom is eliminated from the ring of the aromatic hydrocarbon, such as phenyl group, biphenyl group, fluorenyl group, naphthyl group, anthracyl group, or phenanthryl group, and a heteroaryl group in which a portion of carbon atoms constituting these groups are substituted with a hetero atom such as an oxygen atom, a sulfur atom, or a nitrogen atom. Among these groups, a fluorenyl group is preferable.

The aryl group as for $R^{32}$ may have a substituent such as an alkyl group having 1 to 10 carbon atoms, a halogenated alkyl group, or an alkoxy group. The alkyl group or halogenated alkyl group in the substituent preferably has 1 to 8 carbon atoms, and more preferably 1 to 4 carbon atoms. Also, the halogenated alkyl group is preferably a fluorinated alkyl group.

The alkyl group having no substituent or halogenated alkyl group as for $R^{33}$ preferably has 1 to 10 carbon atoms, more preferably 1 to 8 carbon atoms, and most preferably 1 to 6 carbon atoms.

$R^{33}$ is preferably a halogenated alkyl group, more preferably a fluorinated alkyl group, and most preferably a partially fluorinated alkyl group.

In the fluorinated alkyl group as for $R^{33}$, 50% or more of hydrogen atoms of the alkyl group are preferably fluorinated, 70% or more of hydrogen atoms of the alkyl group are more preferably fluorinated, and 90% or more of hydrogen atoms of the alkyl group are still more preferably fluorinated because the strength of the acid generated increases. A completely fluorinated alkyl group in which 100% of hydrogen atoms is substituted with fluorine is most preferable.

In the general formula (B-3), the alkyl group having no substituent or halogenated alkyl group as for $R^{34}$ includes the same groups as those of the alkyl group having no substituent or halogenated alkyl group as for $R^{31}$.

The di- or trivalent aromatic hydrocarbon group as for $R^{35}$ includes a group in which one or two hydrogen atoms are eliminated from the aryl group as for $R^{32}$.

The alkyl group having no substituent or halogenated alkyl group as for $R^{36}$ includes the same groups as those of the alkyl group having no substituent or halogenated alkyl group as for $R^{33}$.

P is preferably from 2.

Specific examples of the oxime sulfonate based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl] acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile.

Also, the oxime sulfonate based acid generator includes compounds represented by the following chemical formula:

Compound Group (B-i)

[Chemical Formula 15]

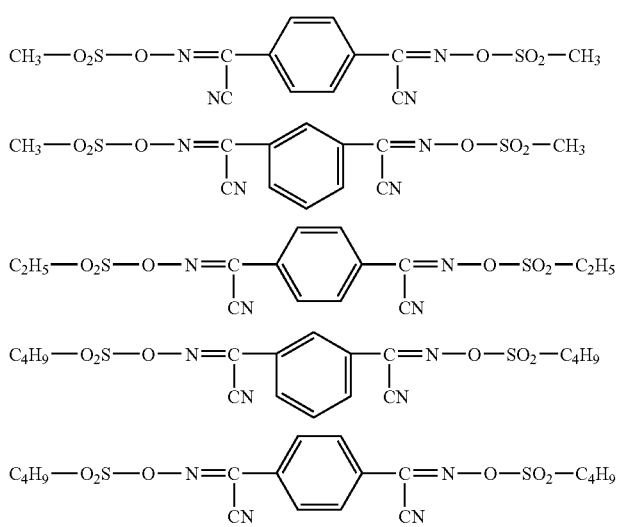

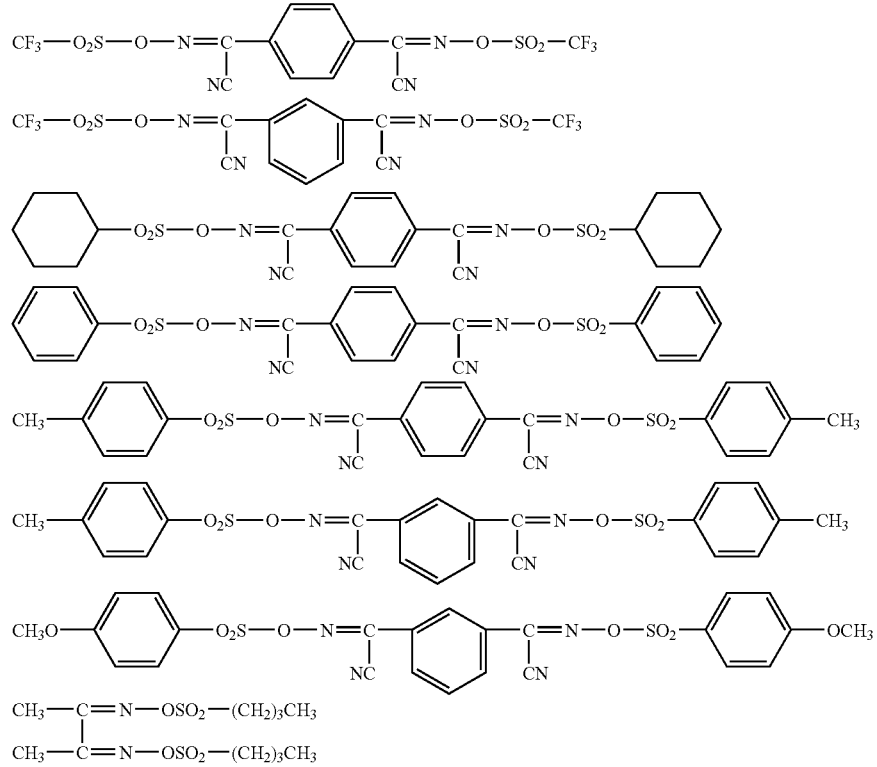
Also, examples of preferable compound among compounds represented by the general formula (B-2) or (B-3) are as follows.
Compound Group (B-ii)
[Chemical Formula 16]
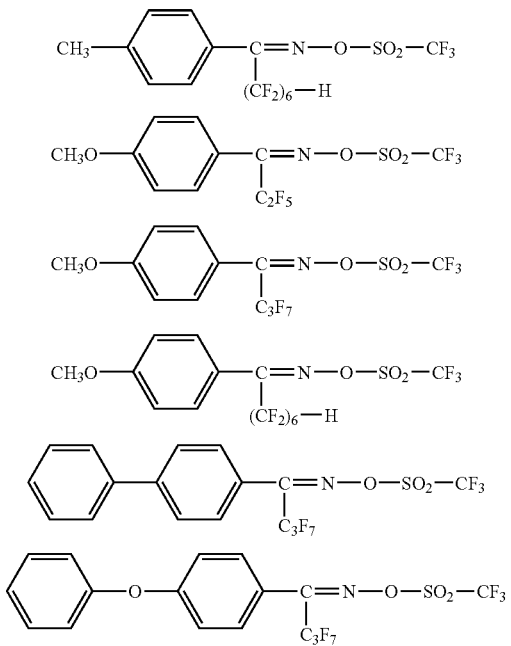

-continued
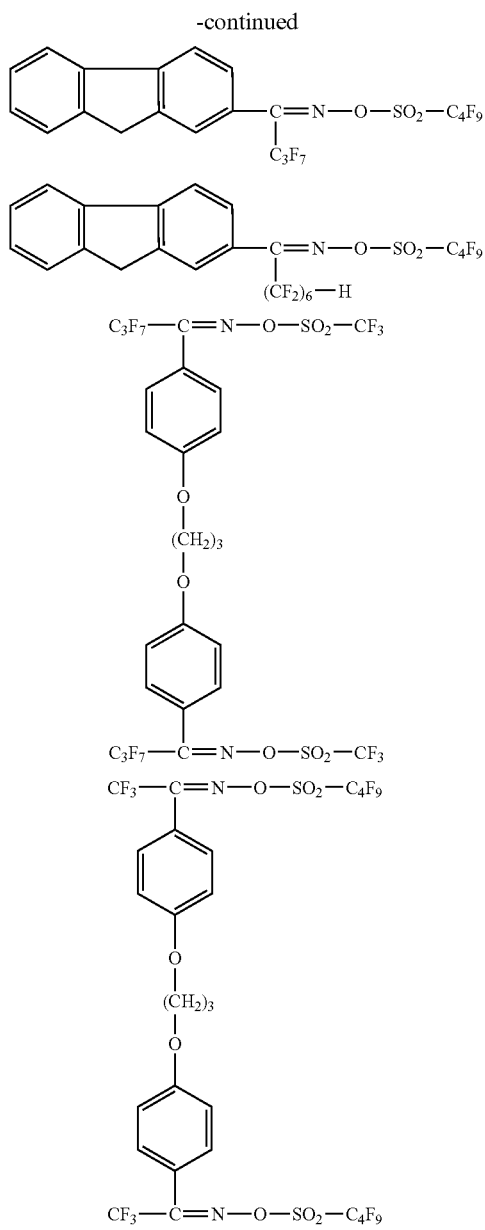
Compound Group (B-iii)
[Chemical Formula 17]
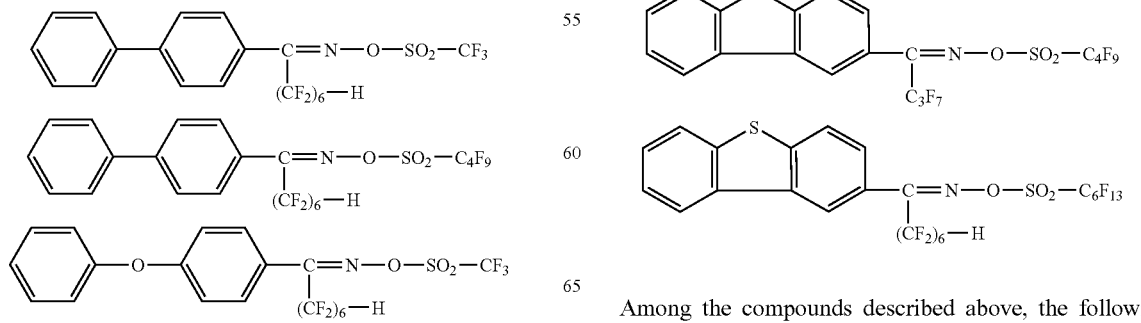
-continued
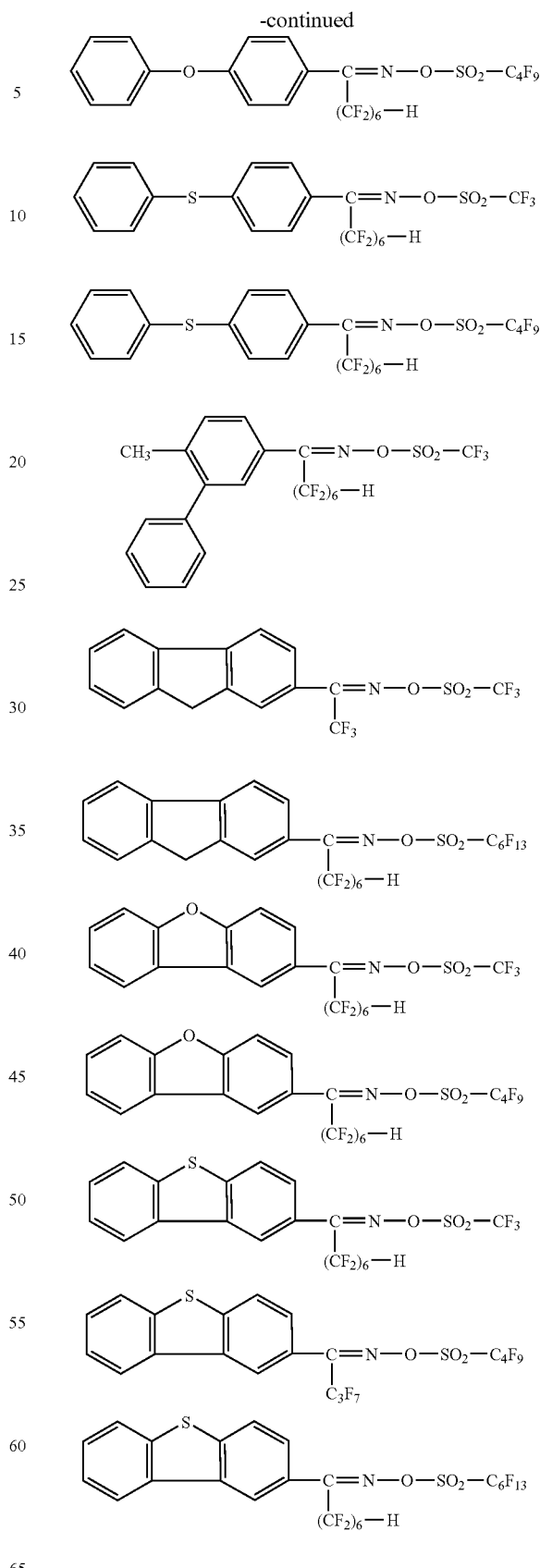
Among the compounds described above, the following three compounds are preferable.

[Chemical Formula 18]

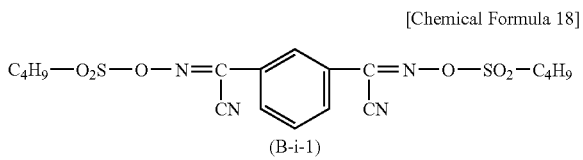

(B-i-1)

[Chemical Formula 19]

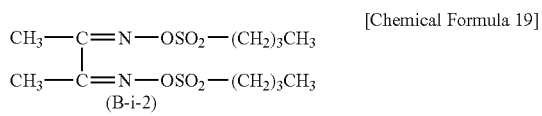

(B-i-2)

[Compound Formula 20]

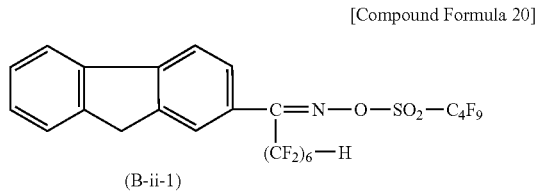

(B-ii-1)

Specific examples of the bisalkyl or bisarylsulfonyl diazomethanes, among diazomethane based acid generators, include bis(isopropylsulfonyl)diazomethane, bis(p-toluenesulfonyl) diazomethane, bis(1,1-dimethylethylsulfonyl)diazomethane, bis(cyclohexylsulfonyl)diazomethane, and bis(2,4-dimethylphenylsulfonyl)diazomethane.

Also, examples of poly(bissulfonyl)diazomethanes include 1,3-bis(phenylsulfonyldiazomethylsulfonyl)propane (in case of A=3), 1,4-bis(phenylsulfonyldiazomethylsulfonyl)butane (in case of A=4), 1,6-bis(phenylsulfonyldiazomethylsulfonyl)hexane (in case of A=6), 1,10-bis(phenylsulfonyldiazomethylsulfonyl)decane (in case of A=10), 1,2-bis(cyclohexylsulfonyldiazomethylsulfonyl)ethane (in case of B=2), 1,3-bis(cyclohexylsulfonyldiazomethylsulfonyl)propane (in case of B=3), 1,6-bis(cyclohexylsulfonyldiazomethylsulfonyl)hexane (in case of B=6), and 1,10-bis(cyclohexylsulfonyldiazomethylsulfonyl)decane (in case of B=10), each having the following structure.

Compound Group (B-iv)

[Chemicla Formula 21]

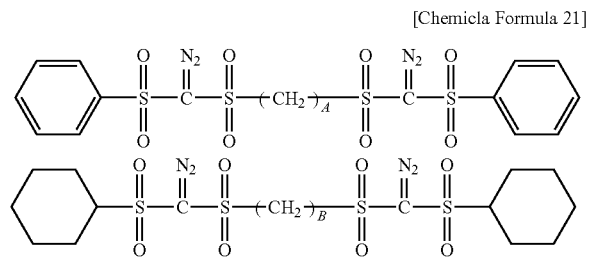

In the present invention, it is preferred to use, as the component (B), an oxime sulfonate based acid generator and/or an onium salt based acid generator containing a fluorinated alkylsulfonic acid ion as an anion.

As the component (B), these acid generators may be used alone, or two or more kinds of them may be used in combination.

The content of the component (B) in the negative resist composition of the present invention is adjusted from 0.5 to 30 parts by mass, and preferably from 1 to 15 parts by mass, based on 100 parts by mass of the component (A). When the content is within the above range, a pattern is sufficiently formed. Also, a uniform solution is obtained and storage stability is improved, preferably.

(Optional Components)

The positive resist composition of the present invention can contain, as optional components, a nitrogen-containing organic compound (excluding the component (B)) (D) (hereinafter referred to as a component (D)) so as to improve resist pattern shape, and post exposure stability of the latent image formed by the pattern-wise exposure of the resist layer.

Since various compounds have already been proposed as the component (D), compounds may be optionally selected from known compounds. Examples of the component (D) include aliphatic amine, for example, monoalkylamine such as n-hexylamine, n-heptylamine, n-octylamine, n-nonylamine, or n-decylamine; dialkylamine such as diethylamine, di-n-propylamine, di-n-heptylamine, di-n-octylamine, or icyclohexylamine; trialkylamine such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcohol amine such as diethanolamine, triethanolamine, diisopropanolamine, triisopropanolamine, di-n-octanolamine, or tri-n-octanolamine. Among these compounds, a secondary aliphatic amine or a tertiary aliphatic amine is preferable, a trialkylamine having 5 to 10 carbon atoms is more preferable, and a tri-n-octylamine is most preferable.

As the component (D), an aromatic amine can also be preferably used. Examples of the aromatic amine include primary amine such as benzylamine, phenylamine, or phenethylamine; secondary amine such as dibenzylamine, diphenylamine, or diphenethylamine; and a tertiary amine such as triphenylamine, tribenzylamine, or triphenethylamine. Among these compounds, tribenzylamine is preferably because of excellent effects of the present invention.

These compounds may be used alone, or two or more kinds of them may be used in combination.

The component (D) is usually used in the proportion within a range from 0.01 to 5.0 parts by mass based on 100 parts by mass of the component (A).

The positive resist composition of the present invention can further contain, as optional components, an organic carboxylic acid, or a phosphorus oxo acid or derivatives thereof (E) (hereinafter referred to as a component (E)) so as to prevent any deterioration in sensitivity caused by the addition of the component (D), and to improve the resist pattern shape and the post exposure stability of the latent image formed by the pattern-wise exposure of the resist layer. The component (D) and the component (E) can be used in combination, or either one can also be used alone.

Examples of suitable organic carboxylic acids include malonic acid, citric acid, malic acid, succinic acid, benzoic acid, and salicylic acid.

Examples of the phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, among which phosphonic acid is particularly preferable.

The component (E) is used in the proportion within a range from 0.01 to 5.0 parts by mass based on 100 parts by mass of the component (A).

Other miscible additives can also be added to the positive resist composition of the present invention, if necessary, and examples thereof include additive resins for improving the properties of the resist film, surfactants for improving the ease of application, dissolution inhibitors, plasticizers, stabilizers, colorants, halation prevention agents, and dyes.

(Organic Solvent)

The positive resist composition of the present invention can be produced by dissolving the materials in an organic solvent.

The organic solvent may be any solvent capable of dissolving each of the components used to give a uniform solution, and one or more kinds of solvents selected from known materials used as the solvents for conventional chemically amplified photoresists can be used.

Examples thereof include latones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used alone, or as a mixed solvent of two or more different solvents.

A mixed solvent obtained by mixing propylene glycol monomethyl ether acetate (PGMEA) with a polar solvent is preferable. A mixing ratio (mass ratio) may be appropriately selected considering compatibility between PGMEA and the polar solvent, but is preferably adjusted within a range from 1:9 to 9:1, and more preferably from 2:8 to 8:2.

More specifically, when EL is added as the polar solvent, a mass ratio of PGMEA to EL is preferably from 1:9 to 9:1, and more preferably from 2:8 to 8:2.

The organic solvent is also preferably a mixed solvent of at least one kind selected from PGMEA and EL, and γ-butyrolactone. In this case, regarding a mixing ratio, a mass ratio of the former to the latter is preferably adjusted within a range from 70:30 to 95:5.

The amount of the organic solvent is not specifically limited and is appropriately adjusted according to the thickness of the coating film so as to attain the concentration which enables application to a substrate. The organic solvent is used so that the solid content of the resist composition is adjusted within a range from 2 to 20% by mass, and preferably from 5 to 15% by mass.

(Resist Pattern Forming Method)

A method for forming a resist pattern of the present invention can be conducted, for example, in the following manner.

Namely, the positive resist composition described above is first applied on the surface of a substrate such as a silicon wafer using a spinner, and prebaking (post apply baking (PAB)) is then conducted under temperature conditions of 80 to 150° C. for 40 to 120 seconds, and preferably for 60 to 90 seconds, followed by selective exposure to electron beam or far ultraviolet ray through a desired mask pattern, or exposure without using the mask pattern using an electron beam lithography apparatus. Namely, after exposure through the mask pattern, or direct patterning with an electron beam without using the mask pattern, a heat treatment (post exposure baking (PEB)) is conducted under temperature conditions of 80 to 150° C. for 40 to 120 seconds, and preferably for 60 to 90 seconds. Subsequently, developing is conducted using an alkali developing solution such as an aqueous 0.1 to 10 mass % solution of tetramethylammonium hydroxide (TMAH). In such a manner, a resist pattern which is faithful to the mask pattern can be obtained.

An organic or inorganic anti-reflective film can also be provided between the substrate and the coating layer.

The wavelength of electron beam and other far ultraviolet ray used for the exposure is not specifically limited, and an ArF excimer laser, a KrF excimer laser, a $F_2$ excimer laser, or other radiation such as EUV (Extreme Ultra Violet), VUV (Vacuum Ultra Violet), EB, X-ray or soft X-ray radiation can be used.

The positive resist composition of the present invention can be preferably used for formation of a resist pattern including an exposure step under vacuum and is preferable for KrF excimer laser, electron beam or EUV (extreme ultra violet), particularly electron beam.

As described above, according to the present invention, a high resolution pattern with reduced LER can be formed. The reason why such an effect is exerted is considered as follows. Namely, in the structural unit (a2), since a fluorine atom or fluorinated lower alkyl group is bonded at the α-position, acid dissociable, dissolution inhibiting groups are likely to be dissociated. The acid dissociable, dissolution inhibiting groups are likely to be dissociated, a rate of dissociation of the acid dissociable, dissolution inhibiting groups existing in the exposed area (deprotection rate) upon exposure is high, and thus alkali solubility of the exposed area remarkably increases and a difference in alkali solubility (solubility contrast) between the unexposed area and the exposed area increases. Because of a structural unit derived from an acrylate ester, transparency to a KrF excimer laser to an exposure light source increases as compared with the case of comprising only a hydroxystyrene based structural unit such as a structural unit (a1) or a structural unit (a3), and thus exposure light completely penetrates from the upper portion of a resist film to the vicinity of the interface of a substrate and an acid generated from the component (B) is efficiently decomposed. As a result, it is assumed that LER is reduced and resolution is improved.

Although the reason is not sure in the present invention, even in case of high exposure margin and slightly shifted light exposure, the resist pattern thus formed causes less dimensional change.

Also, the resist pattern thus formed is excellent in shape, namely, it has reduced LER and also has high rectangularity (cross-sectional rectangular formability) of a profile.

EXAMPLE 1

Examples of the present invention will now be described, but the scope of the present invention is not limited to the following Examples.

SYNTHESIS EXAMPLES 1 AND 2

Resins 1 and 2 were synthesized by the following procedures.

(1) Synthesis of Precursor Polymer

In a four-necked flask equipped with a nitrogen blowing tube, a refluxer, a dropping funnel and a thermometer, 141 g of isopropyl alcohol, 7 g of 4-acetoxystyrene and 3 g of 3-hydroxy-1-adamantyl-α-trifluoromethyl acrylate were charged and the atmosphere in the flask was replaced by nitrogen, followed by heating to 82° C. with stirring. While maintaining the temperature, a solution prepared by dissolving 187 g of 4-acetoxystyrene, 84 g of 3-hydroxy-1-adamantyl-α-trifluoromethyl acrylate and 17 g of 2,2'-azobisisobutyronitrile in 114 g of isopropyl alcohol was added dropwise over 3 hours. After the completion of dropwise addition, stirring was continued for 4 hours while maintaining the temperature.

After cooling to 20° C., the precipitate was sedimented. After removing the supernatant, 240 g of propyl alcohol was added and dissolved with stirring at 75° C. To the resulting solution, 9 g of 35 mass % hydrochloric acid and 43 g of water were added dropwise and, after stirring at 75° C. for 7 hours, the reaction was terminated by cooling to 20° C.

To the resulting reaction solution, 2,000 g of ethyl acetate was added and the ethyl acetate solution was washed with a large amount of water. Then, ethyl acetate was distilled off under a normal pressure and the precipitated white solid was dissolved in 1,030 g of tetrahydrofuran to obtain 1,237 g of a tetrahydrofuran solution of a precursor polymer.

(2) Synthesis of Resin 1

In a four-necked flask equipped with a nitrogen blowing tube, a dropping funnel and a thermometer, 310 g of the tetrahydrofuran solution obtained in (1) and 10 g of ethyl vinyl ether were charged, followed by stirring at 20° C. and the addition of a catalytic amount of p-toluenesulfonic acid monohydrate. After stirring for 4 hours while maintaining at the same temperature, triethylamine was added, thereby terminating the reaction.

The resulting reaction solution was added dropwise in a large amount of water to obtain a precipitate. The precipitate was collected by filtration, washed and then dried to obtain 55 g of a random copolymer (resin 1) as a white solid.

(3) Synthesis of Resin 2

In the same manner as in (2), except that the amount of ethyl vinyl ether added in (2) was replaced by 13 g, 56 g of a random copolymer (resin 2) was obtained as a white solid.

(4) Identification of White Solids Obtained in (2) and (3)

(Resin 1)

Polystyrene equivalent weight average molecular weight determined using gel permeation chromatography (GPC): 10,000, dispersion degree: 2.22, a/b/c/d=56/17/24/3 (molar ratio) as a result of hydrogen isotope nuclear magnetic resonance ($^1$H-NMR) and carbon isotope nuclear magnetic resonance ($^{13}$C-NMR) analysis.

(Resin 2)

Polystyrene equivalent weight average molecular weight determined using gel permeation chromatography (GPC): 10,000, dispersion degree: 2.2, a/b/c/d=64/18/16/2 (molar ratio) as a result of hydrogen isotope nuclear magnetic resonance ($^1$H-NMR) and carbon isotope nuclear magnetic resonance ($^{13}$C-NMR) analysis.

Structures of resins 1 and 2 are shown in the following formula (a-1).

[Chemical Formula 22]

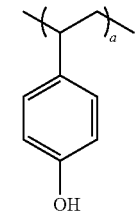
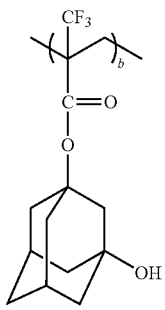
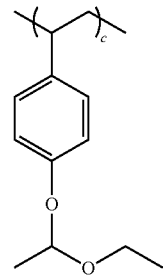
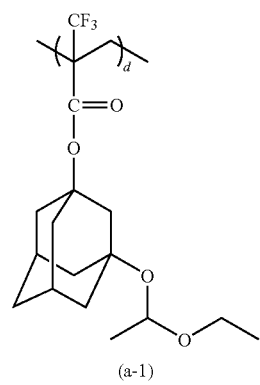

(a-1)

SYNTHESIS EXAMPLE 3

(1) Synthesis of Resin 3

In a four-necked flask equipped with a nitrogen blowing tube, a refluxer, a dropping funnel and a thermometer, 67 g of isopropyl alcohol, 6 g of 4-acetoxystyrene, 2 g of 4-(1-ethoxyethoxy)styrene and 2 g of t-butyl-α-trifluoromethyl acrylate were charged and the atmosphere in the flask was replaced by nitrogen, followed by heating to 82° C. with stirring. While maintaining the temperature, a solution prepared by dissolving 55 g of 4-acetoxystyrene, 22 g of 4-(1-ethoxyethoxy)styrene, 22 g of t-butyl-α-trifluoromethyl acrylate and 8 g of 2,2'-azobis-(2-methylbutyronitrile) in 62 g of isopropyl alcohol was added dropwise over 3.5 hours. After the completion of dropwise addition, stirring was continued for 3 hours while maintaining the temperature. After cooling to 25° C., the precipitate was sedimented. After removing the supernatant, the sedimented precipitate was dissolved in 110 g of tetrahydrofuran. To the solution, 28 g of an aqueous 80 mass % hydrazine solution was added dropwise and, after stirring at 25° C. for 3 hours, the reaction was terminated.

The resulting solution was added dropwise in a large amount of water to obtain a precipitate. The resulting precipitate was collected by filtration, washed and then dried to obtain a random copolymer (resin 3) as a white solid.

(2) Identification of White Solid Obtained in (1)

(Resin 3)

Polystyrene equivalent weight average molecular weight determined using gel permeation chromatography (GPC): 8,500, dispersion degree: 1.53, composition ratio of monomer through carbon isotope nuclear magnetic resonance ($^{13}$C-NMR) analysis: 4-hydroxystyrene/4-(1-ethoxyethoxy)styrene/t-butyl-α-trifluoromethyl acrylate=40/30/30 (molar ratio)

Structure of the resin 3 is shown in the following formula (a-2).

In the formula (a-2), a ratio of a, b and c (molar ratio), a/b/c=40/30/30.

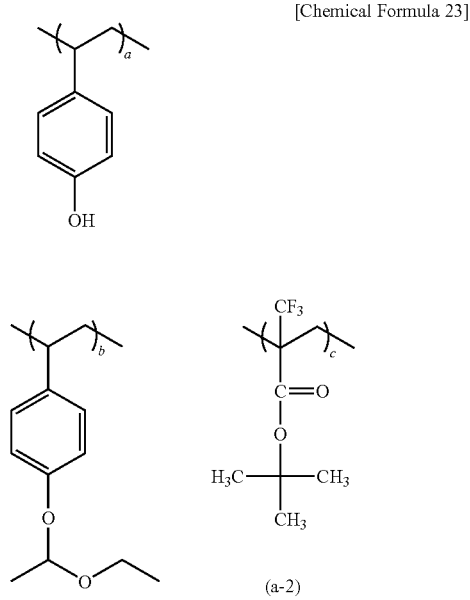

[Chemical Formula 23]

(a-2)

EXAMPLE 1

According to the formulation shown in Table 1, a positive resist composition solution was prepared. The positive resist composition solution was uniformly applied on a 8 inch silicone substrate subjected to a hexamethyldisilazane treatment and then subjected to a baking treatment (PAB) under the conditions shown in Table 2 for 90 seconds to form a 125 nm thick resist film. Using an electron beam lithography apparatus (HL-800D, manufactured by Hitachi, Ltd., accelerating voltage 70 kV), the resulting resist film was patterned, subjected to a baking treatment (PEB) under the conditions shown in Table 2 for 90 seconds, developed with an aqueous 2.38 mass % TMAH solution at 23° C. for 60 seconds, rinsed with pure water for 30 seconds, subjected to shake-off drying and then subjected to a baking treatment at 100° C. for 60 seconds to form a resist pattern, and then the following evaluation was conducted. The results are summarized in Table 2.

Evaluation Item (Sensitivity)

Sensitivity ($\mu C/cm^2$) in case of forming a 100 nm line-and-space (L/S) pattern (1:1) was measured.

(Resolution)

Limiting resolution in the sensitivity was shown.

(Exposure Margin)

A dimensional change to 1 $\mu C/cm^2$ at ±5% was measured from optimum light exposure in a 100 nm L/S pattern (1:1) and exposure margin was calculated.

(LER)

With respect to the 100 nm L/S pattern obtained at the above sensitivity, a 3σ value as an indicator of LER was determined. The 3σ value was determined by measuring the resist pattern width of the sample at 32 positions using a measuring SEM (S-9220, trade name, manufactured by Hitachi, Ltd.) and calculating the value of 3 times the standard deviation (3σ) from these measurement results. The smaller this 3σ value is, the lower the level of roughness, indicating a resist pattern with a uniform width.

TABLE 1

|  | Component (A) | Component (A) | Component (B) | Component (D) | Organic solvent |
|---|---|---|---|---|---|
| Example 1 | Resin 3 (100) | — | PAG1 (12) | AMINE1 (0.38) | PGMEA (1,560) |
| Example 2 | Resin 2 (100) | — | PAG1 (12) | AMINE1 (0.38) | PGMEA (1,560) |
| Example 3 | Resin 2 (100) | — | PAG1 (8) | AMINE1 (0.38) | PGMEA (1,560) |
| Example 4 | Resin 2 (100) | — | PAG3 (8) | AMINE1 (0.38) | PGMEA (1,560) |
| Example 5 | Resin 2 (75) | Resin 1 (25) | PAG1 (12) | AMINE2 (0.38) | PGMEA (1,560) |
| Example 6 | Resin 2 (75) | Resin 1 (25) | PAG1 (8) | AMINE2 (0.38) | PGMEA (1,560) |
| Example 7 | Resin 2 (75) | Resin 1 (25) | PAG3 (8) | AMINE2 (0.38) | PGMEA (1,560) |
| Comparative Example 1 | Comparative Resin 1 (100) | — | PAG2 (12) | AMINE1 (0.38) | PGMEA (1,560) |

Abbreviations in Table 1 are as follows.
PAG1: triphenylsulfoniumnonafluorobutane sulfonate
PAG2: bis-O-(n-butylsulfonyl)-α-dimethylglyoxime
PAG3: α-(methyloxyimino)-p-methoxyphenylacetonitrile
AMINE1: tri-n-octylamine
AMINE2: tribenzylamine
PGMEA: propylene glycol monomethyl ether acetate Comparative Resin 1: polymer (weight average molecular weight: 10,000, dispersion degree: 1.2, a/b=70:30 (molar ratio)) represented by the following formula (a-3)

TABLE 2

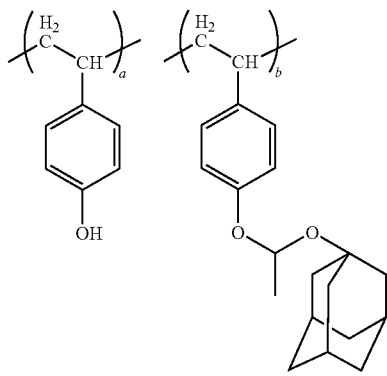

(a-3)

|  | Thickness of resist film | PAB | PEB | Resolution | Sensitivity | LER | Exposure margin |
|---|---|---|---|---|---|---|---|
| Example 1 | 125 nm | 120° C. | 120° C. | 90 nm | 12 µC/cm$^2$ | 10 nm | 16.0% |
| Example 2 | 125 nm | 100° C. | 110° C. | 90 nm | 12 µC/cm$^2$ | 12.0 nm | 17.7% |
| Example 3 | 125 nm | 100° C. | 110° C. | 80 nm | 12 µC/cm$^2$ | 11.5 nm | 19.6% |
| Example 4 | 125 nm | 100° C. | 110° C. | 80 nm | 7 µC/cm$^2$ | 10.2 nm | 20.3% |
| Example 5 | 300 nm | 100° C. | 110° C. | 80 nm | 12 µC/cm$^2$ | 13.6 nm | 15.3% |
| Example 6 | 300 nm | 100° C. | 110° C. | 80 nm | 12 µC/cm$^2$ | 11.2 nm | 18.7% |
| Example 7 | 300 nm | 100° C. | 110° C. | 80 nm | 7 µC/cm$^2$ | 11.5 nm | 19.8% |
| Comparative Example 1 | 125 nm | 100° C. | 110° C. | 90 nm | 12 µC/cm$^2$ | 24.0 nm | 14.0% |

From the results described above, it has been found that the positive resist compositions of Examples 1 to 6 are excellent in both resolution and LER. Also it has been found that the positive resist compositions of Examples 1 to 6 are excellent in exposure margin to that of Comparative Example 1.

INDUSTRIAL APPLICABILITY

According to the present invention, there is provided a positive resist composition and resist pattern forming method, which can form a high resolution pattern with reduced LER.

The invention claimed is:

1. A positive resist composition comprising a resin component (A) which has acid dissociable, dissolution inhibiting groups and exhibits increased alkali solubility under the action of an acid, and an acid generator component (B) which generates an acid under exposure, wherein
the resin component (A) contains a polymer compound (A1) having a structural unit (a1) derived from hydroxystyrene and a structural unit (a2) represented by the following general formula (a2-1):

[Chemical Formula 1]

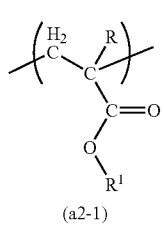

(a2-1)

wherein R represent a fluorine atom or a fluorinated lower alkyl group, and R$^1$ represents an organic group having acid dissociable, dissolution inhibiting groups (II) represented by the following general formula (II):

[Chemical Formula 3]

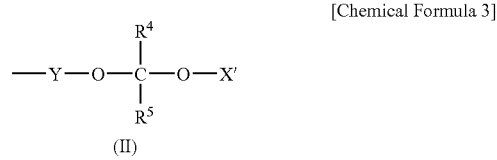

(II)

wherein X' represents an aliphatic cyclic group, an aromatic cyclic hydrocarbon group or a lower alkyl group; R$^4$ represents a hydrogen atom, or a lower alkyl group, or X' and R$^4$ each independently represents an alkylene group having 1 to 5 carbon atoms and the end of X' and the end of R$^4$ may be bonded; R$^5$ represents a lower alkyl group or a hydrogen atom; and Y represents an aliphatic cyclic group.

2. The positive resist composition according to claim 1, wherein the polymer compound (A1) furthers comprises a structural unit (a3) in which hydrogen atoms of a hydroxyl group in the structural unit (a1) are substituted with acid dissociable, dissolution inhibiting groups.

3. The positive resist composition according to claim 2, wherein the proportion of the structural unit (a3) is from 5 to 50 mol % based on the entire structural units constituting the polymer compound (A1).

4. The positive resist composition according to claim 1, wherein the polymer compound (A1) further comprises a structural unit (a4) derived from an acrylate ester having an alcoholic hydroxyl group, a fluorine atom or a fluorinated lower alkyl group being bonded at the α-position.

5. The positive resist composition according to claim 4, wherein the structural unit (a4) has a chain or cyclic alkyl group having an alcoholic hydroxyl group.

6. The positive resist composition according to claim 4, wherein the proportion of the structural unit (a4) is from 5 to 50 mol % based on the entire structural units constituting the polymer compound (A1).

7. The positive resist composition according to claim 1, wherein the proportion of the structural unit (a1) is from 10 to 85 mol % based on the entire structural units constituting the polymer compound (A1).

8. The positive resist composition according to claim 1, wherein the proportion of the structural unit (a2) is from 1 to 80 mol % based on the entire structural units constituting the polymer compound (A1).

9. The positive resist composition according to claim 1, wherein a weight average molecular weight of the polymer compound (A1) is within a range from 3,000 to 30,000.

10. The positive resist composition according to claim 1, which further contains a nitrogen-containing organic compound (D).

11. A resist pattern forming method comprising the steps of forming a resist film on a substrate using the positive resist composition according to any one of claims 1 to 10, selectively exposing the resist film, and alkali-developing the resist film to form a resist pattern.

* * * * *